United States Patent
Tsai et al.

(10) Patent No.: US 11,410,923 B2
(45) Date of Patent: Aug. 9, 2022

(54) SEMICONDUCTOR DEVICE, INTEGRATED FAN-OUT PACKAGE AND METHOD OF FORMING THE SAME

(71) Applicant: Taiwan Semiconductor Manufacturing Co., Ltd., Hsinchu (TW)

(72) Inventors: Chung-Hao Tsai, Changhua County (TW); Chen-Hua Yu, Hsinchu (TW); Chuei-Tang Wang, Taichung (TW); Wei-Ting Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 201 days.

(21) Appl. No.: 16/035,708

(22) Filed: Jul. 16, 2018

(65) Prior Publication Data

US 2020/0020627 A1    Jan. 16, 2020

(51) Int. Cl.
  *H01L 23/00* (2006.01)
  *H01L 23/522* (2006.01)
  *H01L 27/07* (2006.01)
  *H01L 21/768* (2006.01)

(52) U.S. Cl.
  CPC .... *H01L 23/5226* (2013.01); *H01L 21/76816* (2013.01); *H01L 23/562* (2013.01); *H01L 24/09* (2013.01); *H01L 24/14* (2013.01); *H01L 24/17* (2013.01); *H01L 27/0727* (2013.01); *H01L 2224/02372* (2013.01); *H01L 2224/02379* (2013.01); *H01L 2224/0401* (2013.01)

(58) Field of Classification Search
  CPC .......................... H01L 23/562; H01L 23/5226
  See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2005/0133894 A1* | 6/2005 | Bohr | H01L 24/13 257/678 |
| 2012/0273937 A1* | 11/2012 | Choi | H01L 24/81 257/737 |

(Continued)

*Primary Examiner* — Kenneth Parker
*Assistant Examiner* — Long H Le
(74) *Attorney, Agent, or Firm* — JCIPRNET

(57) ABSTRACT

A semiconductor device, an integrated fan-out package and a method of forming the same are disclosed. In some embodiments, a semiconductor device includes a substrate, a conductive layer, a passivation layer and a bump structure. The substrate has at least one electronic component therein. The conductive layer has a plurality of lines patterns over and electrically connected to the at least one electronic component. The passivation layer is over the conductive layer. The bump structure has a plurality of protruding parts penetrating through the passivation layer and electrically connected to the lines patterns of the conductive layer.

20 Claims, 15 Drawing Sheets

(56) References Cited

U.S. PATENT DOCUMENTS

| | | | |
|---|---|---|---|
| 2013/0049188 A1* | 2/2013 | Choi | H01L 23/3135 |
| | | | 257/717 |
| 2013/0228897 A1* | 9/2013 | Chen | H01L 21/481 |
| | | | 257/621 |
| 2014/0145327 A1* | 5/2014 | Jeon | H01L 24/13 |
| | | | 257/737 |
| 2016/0276307 A1* | 9/2016 | Lin | H01L 21/561 |
| 2019/0206783 A1* | 7/2019 | Kim | H01L 23/49827 |

* cited by examiner

SEMICONDUCTOR DEVICE, INTEGRATED FAN-OUT PACKAGE AND METHOD OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of packages for semiconductors include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Currently, integrated fan-out packages are becoming increasingly popular for their compactness. However, there are many challenges related to integrated fan-out packages.

DETAILED DESCRIPTION

Figure 1A:
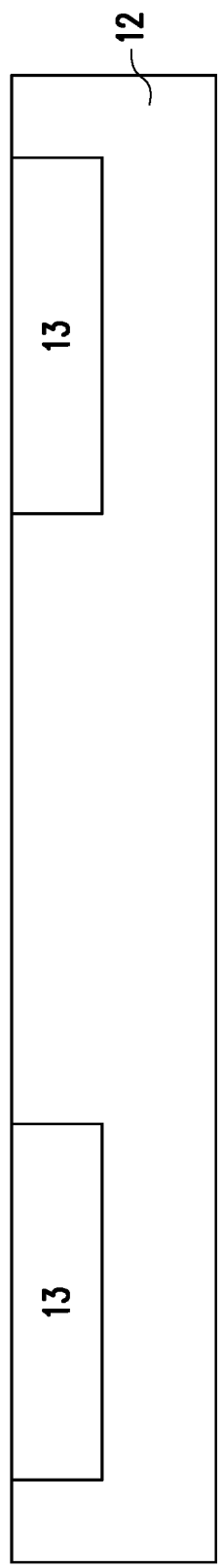
FIG. 1A to FIG. 1F are cross-sectional views of a method of forming a semiconductor device in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1F are cross-sectional views of a method of forming a semiconductor device in accordance with some embodiments. FIG. 2 to FIG. 7 are simplified top views of semiconductor devices in accordance with some embodiments, in which few elements such as a top metal layer, a passivation layer and an under bump metallization (UBM) layer are shown for simplicity and clarity of illustration.

Referring to FIG. 1A, at least one electronic component 13 is formed in a substrate 12. In some embodiments, the substrate 12 includes a silicon-containing substrate, a silicon-on-insulator (SOI) substrate, or a substrate formed of other suitable semiconductor materials. In some embodiments, two electronic components 13 are embedded in a surface portion of the substrate 12. In some embodiments, the electronic components 13 are integrated passive devices (IPD) including resistors, capacitors, inductors, resonators, filters, and/or the like. For example, the electronic components 13 are trench capacitors having same or different capacitance values, resonance frequencies, and/or sizes. However, the present disclosure is not limited thereto. In alternative embodiments, the electronic components 13 can be integrated active devices (IAD). In some embodiments, the substrate 12 may have isolation structures, through silicon vias (TSV) and/or doped regions upon the process requirements.

Figure 1B:
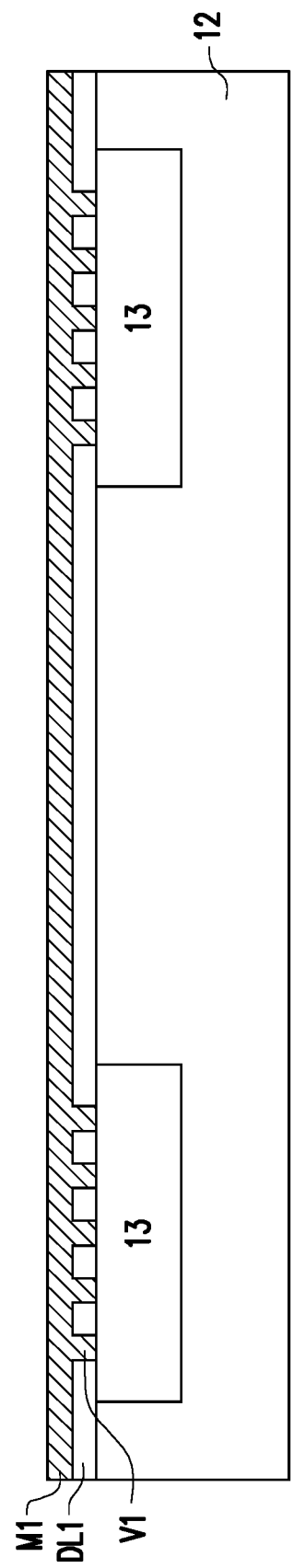
Figure 1C:
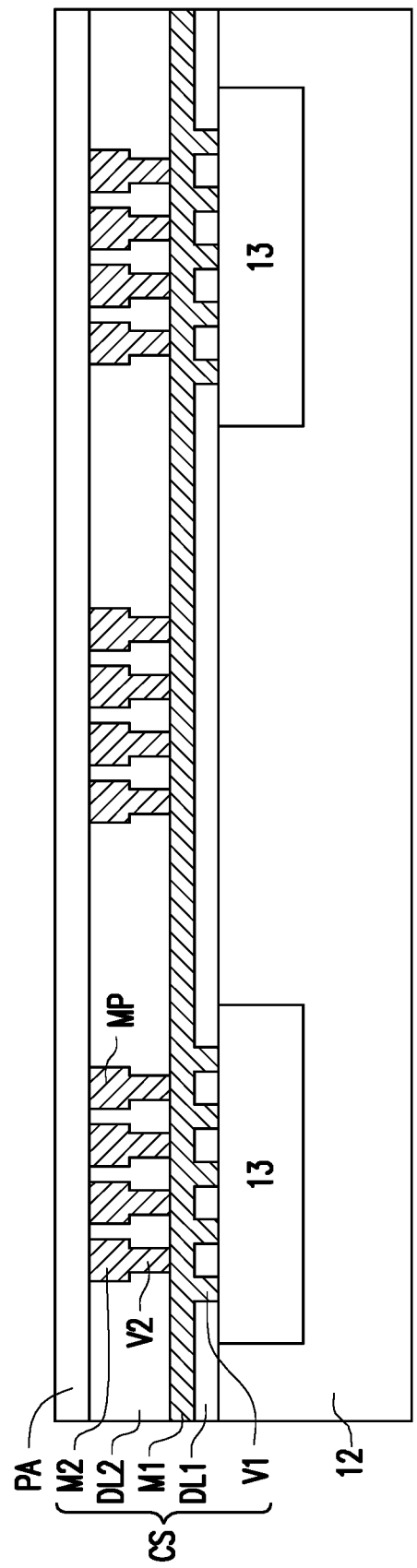

Referring to FIG. 1B and FIG. 1C, a conductive structure CS is formed over and electrically connected to the electronic components 13. In some embodiments, the conductive structure CS is referred to as an interconnection structure. The conducive structure CS includes dielectric layers and conductive features. In some embodiments, the dielectric layers include silicon oxide, silicon oxynitride, silicon nitride, a low dielectric constant (low-k) material or a combination thereof and are formed by suitable processes such as chemical vapor deposition (CVD) or the like. Each of the dielectric layers may be a single layer or a multiple-layer structure. In some embodiments, the dielectric layers include a dielectric layer DL1 and a dielectric layer DL2 over the dielectric layer DL1. In some embodiments, the conductive features include conductive layers and vias. The conductive features include a metal-containing material, such as tungsten (W), copper (Cu), a copper alloy, aluminum (Al), an aluminum alloy or a combination thereof. In some embodiments, a barrier layer may be disposed between the conductive features and the dielectric layers to prevent the metal of the conductive features from migrating to the underlying electronic components 13. The barrier layer includes Ta, TaN, Ti, TiN, CoW or a combination thereof, for example.

In some embodiments, as shown in FIG. 1B, a conductive layer M1 is formed over and electrically connected to the electronic components 13 through the vias V1, and the conductive layer M1 and the vias V1 are embedded by the dielectric layer DL1. In some embodiments, the conductive layer M1 and the vias V1 are formed by a dual damascene process. Thereafter, as shown in FIG. 1C, a conductive layer M2 is formed over and electrically connected to the conductive layer M1 through the vias V2, and the conductive layer M2 and the vias V2 are embedded by the dielectric layer DL2. In some embodiments, the conductive layer M2 and the vias V2 are formed by a dual damascene process. However, the present disclosure is not limited thereto. Multiple single damascene processes or electroplating processes may be performed to form the conductive structure CS. The number of the dielectric layers or the conductive layers of the conductive structure CS is not limited by the present disclosure.

In some embodiments, the extending direction of the conductive layer M2 is different from (e.g., perpendicular to) the extending direction of the conductive layer M1 from a top view. In some embodiments, the conductive layer M2 is a top metal layer having a plurality of line patterns MP substantially parallel to each other, as shown in the top views of FIG. 2 to FIG. 7. In some embodiments, the line patterns MP may be designed as power lines or ground lines.

Figure 2:
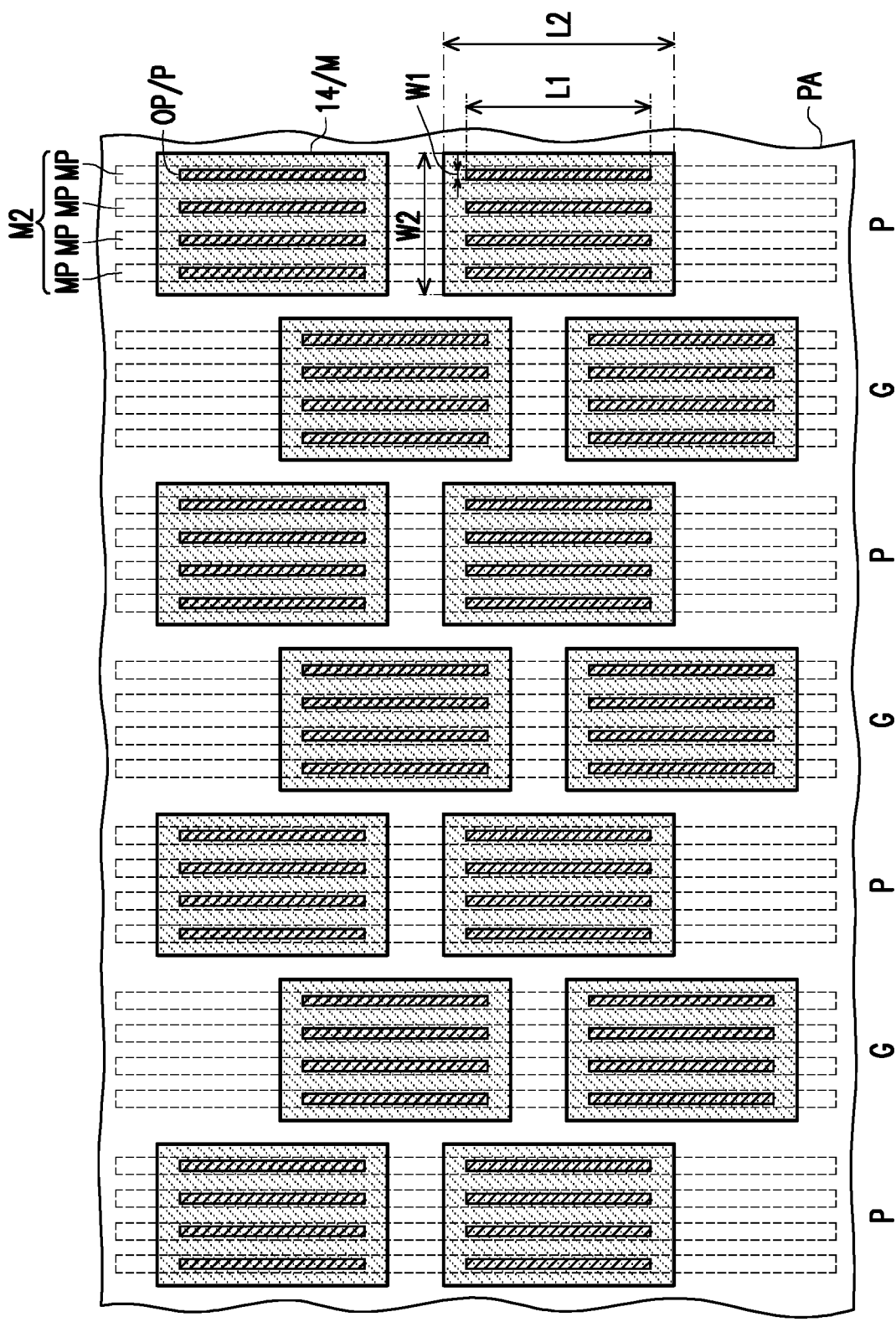
FIG. 2 to FIG. 7 are simplified top views of semiconductor devices in accordance with some embodiments.
Figure 3:
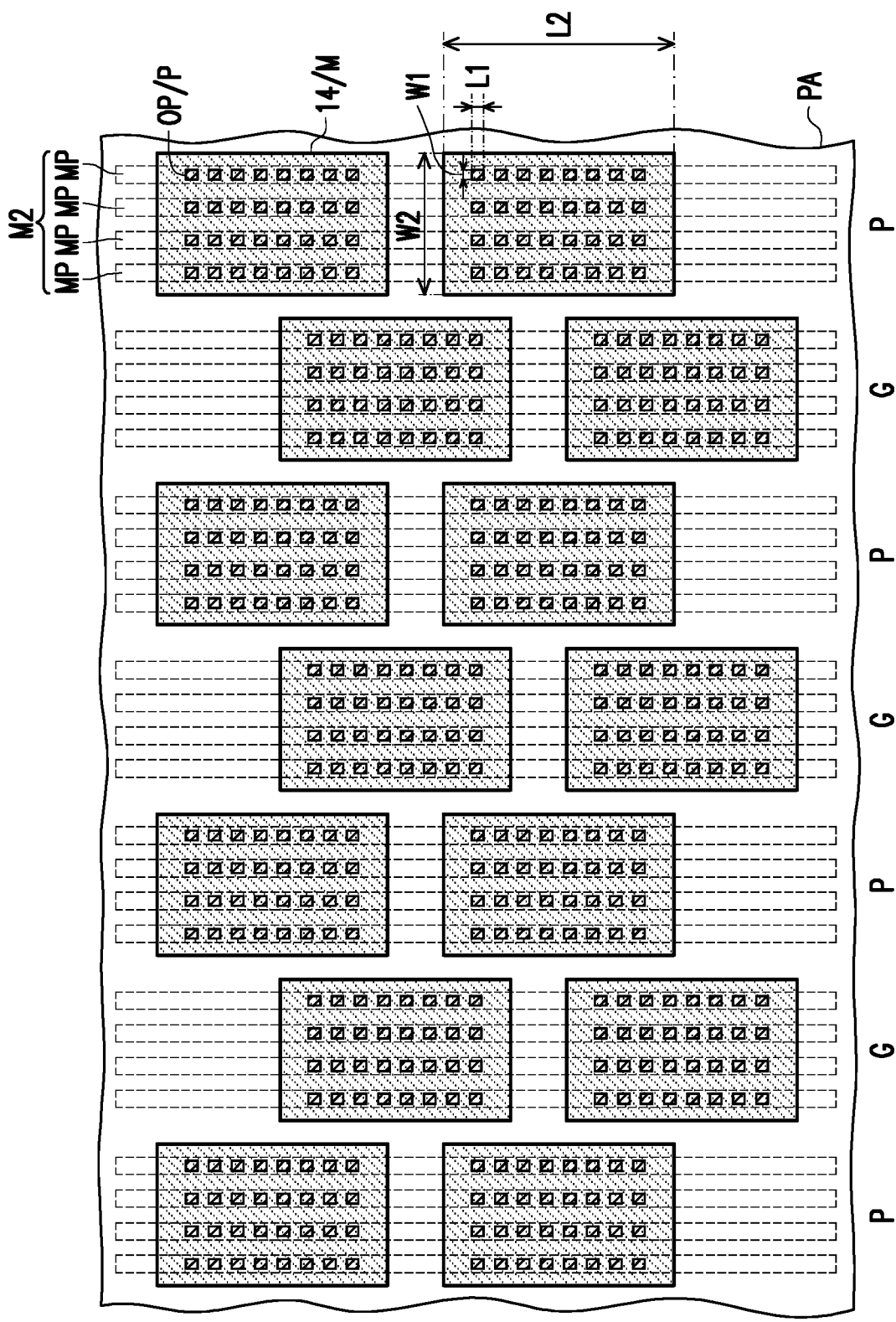

In some embodiments, as shown in FIG. 2 and FIG. 3, the line patterns MP are divided into first groups of line patterns and second groups of line groups alternately arranged, and each of the first and second groups includes, for example but not limited to, four line patterns MP. In some embodiments, the first groups of line patterns are power lines P, and the second groups of line patterns are ground lines G.

Figure 4:
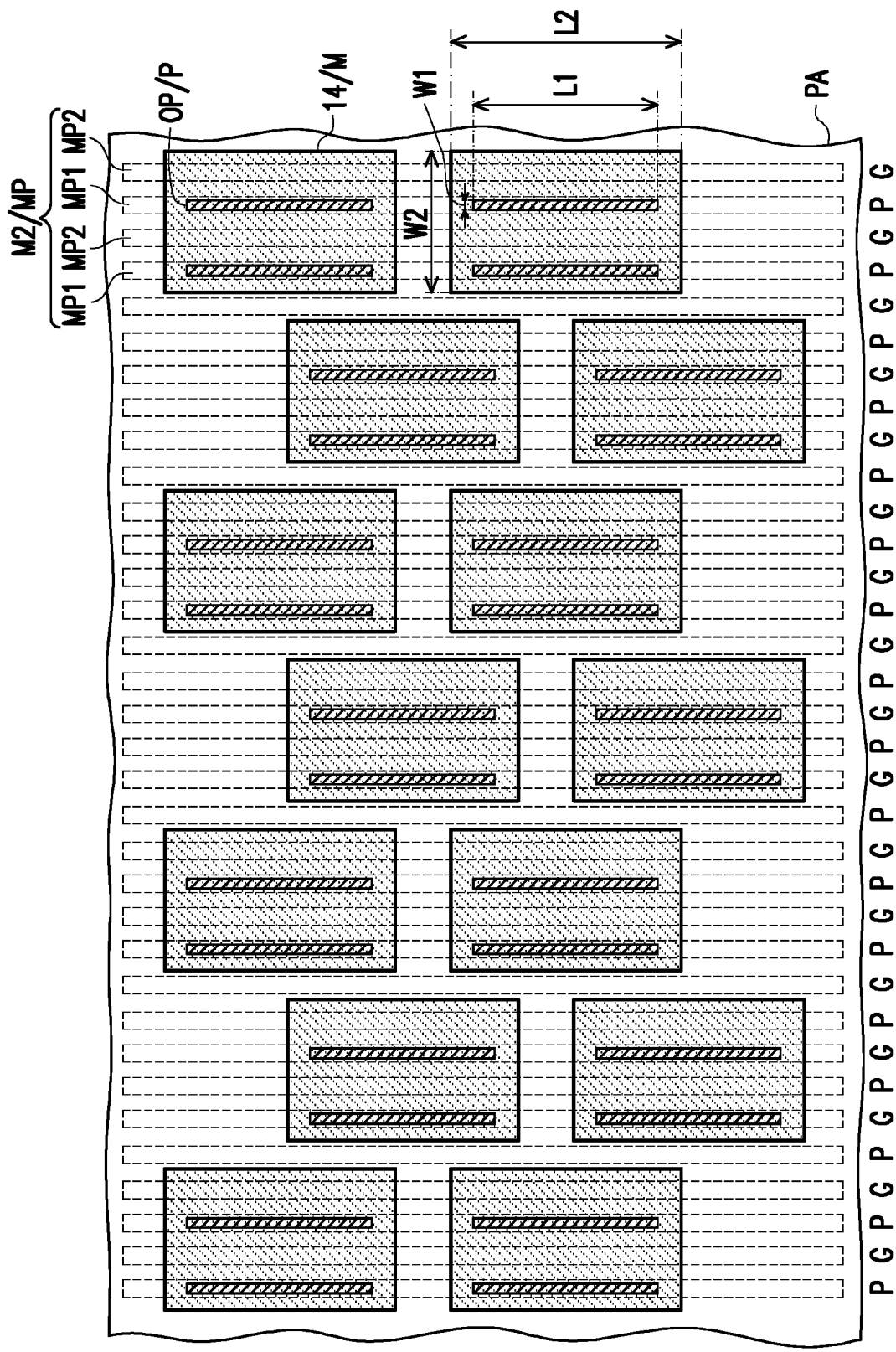
Figure 5:
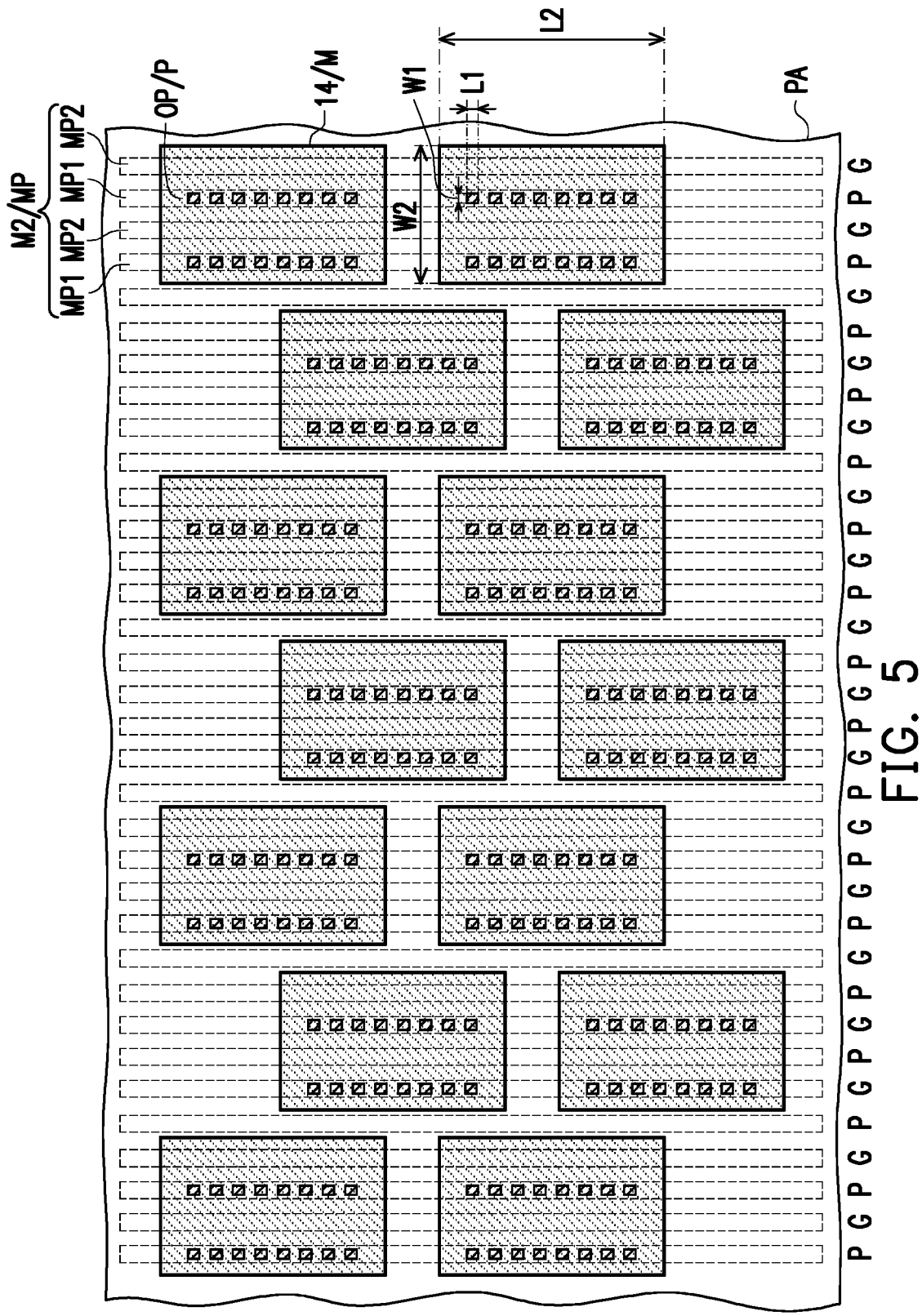

In alternative embodiments, as shown in FIG. 4 and FIG. 5, the line patterns MP include a plurality of first line patterns MP1 and a plurality of second line patterns MP2 alternately arranged, and the first line patterns MP1 are power lines P, and the second line patterns MP2 are ground lines G.

Figure 6:
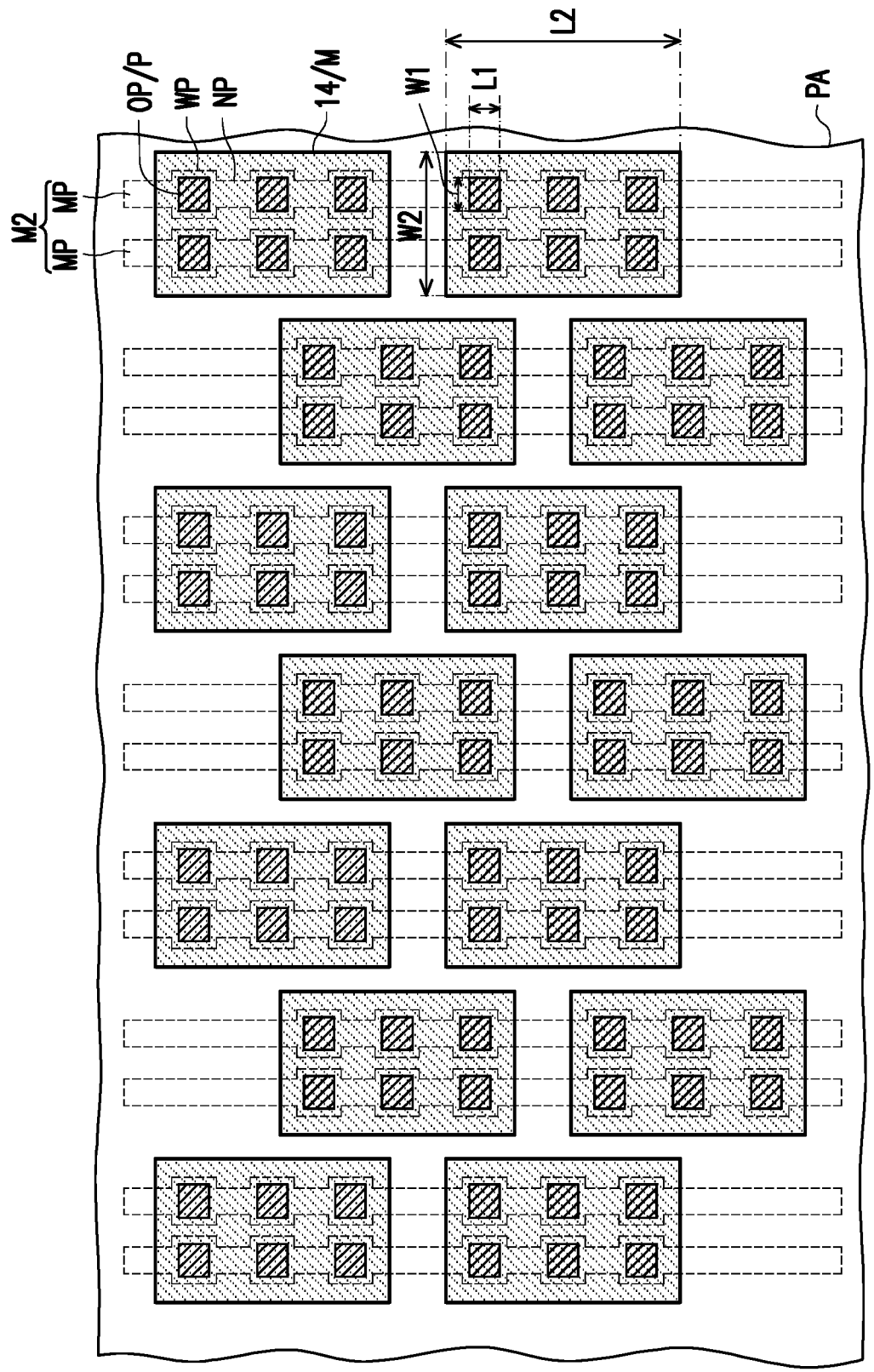
Figure 7:
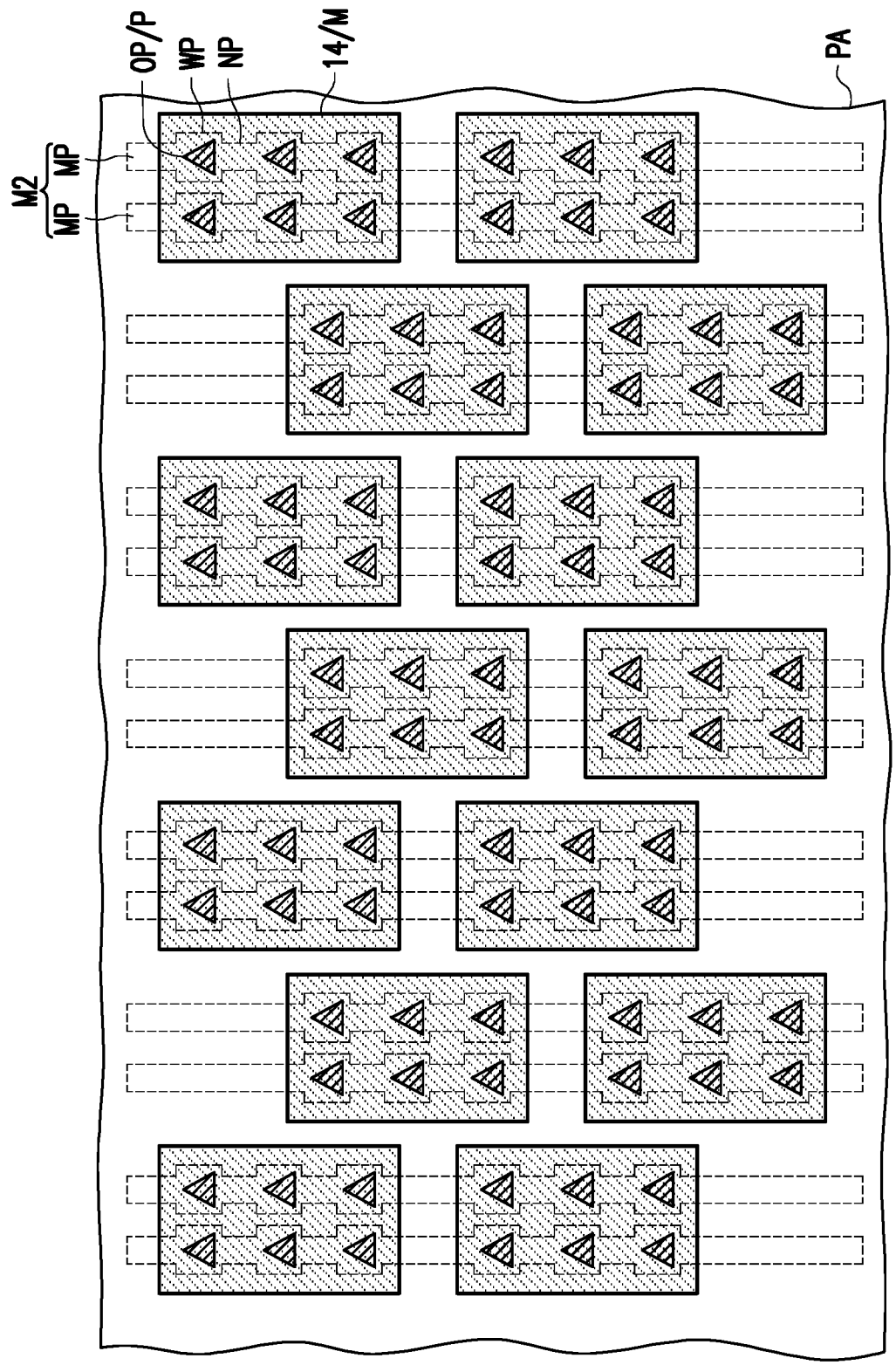

In the embodiments of FIG. 2 to FIG. 5, the line patterns MP are designed as strips or bars. The strips may be straight strips or curve strips. The strips may have the same width. However, the present disclosure is not limited thereto. In some embodiments, upon the process requirements, each of the line patterns MP includes a plurality of wide parts WP and a plurality of narrow parts NP alternately arranged, as shown in FIG. 6 and FIG. 7.

Afterwards, as shown in FIG. 1C, a passivation layer PA is formed over the conductive structure CS. In some embodiments, the passivation layer PA includes silicon oxide, silicon nitride, benzocyclobutene (BCB) polymer, polyimide (PI), polybenzoxazole (PBO) or a combination thereof, and is formed by a suitable process such as spin coating, CVD or the like. The passivation layer PA may be a single layer or a multiple-layer structure.

Figure 1D:
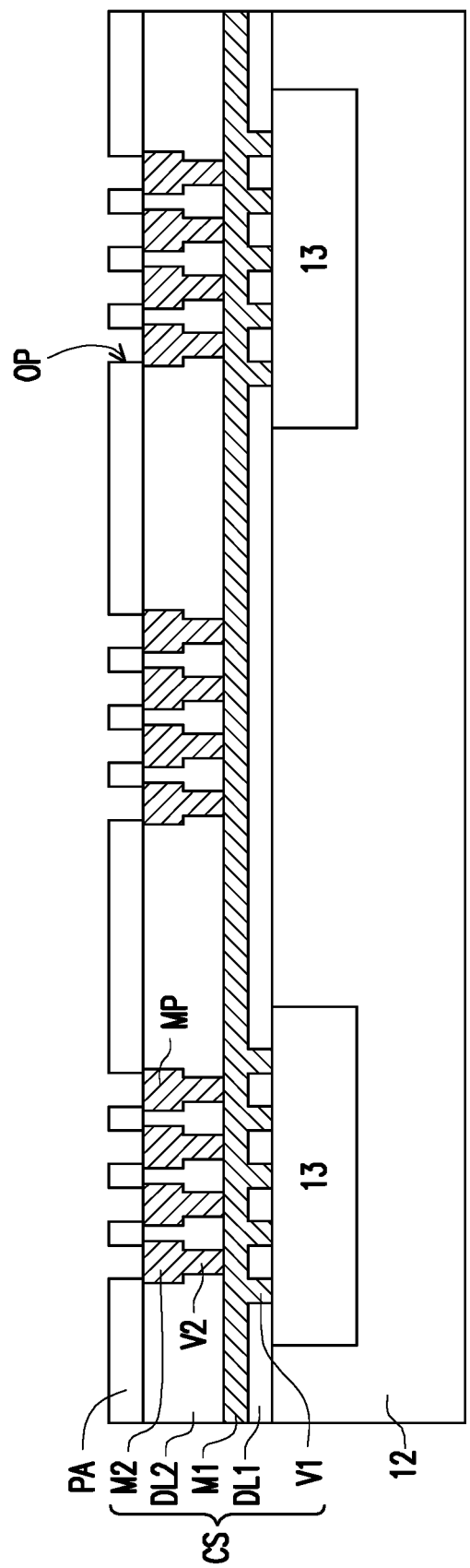

Referring to FIG. 1D, the passivation layer PA is patterned to form a plurality of openings OP therein. In some embodiments, the patterning operation includes performing photolithography and etching processes. In some embodiments, the openings OP penetrate through the passivation layer PA and expose portions of the line patterns MP of the conductive layer M2, as shown in FIG. 2 to FIG. 7.

In some embodiments, as shown in the top view of FIG. 2, FIG. 3, FIG. 6 and FIG. 7, the openings OP of the passivation layer PA partially expose each of the line patterns MP of the conductive layer M2. However, the present disclosure is not limited thereto. In some embodiments, the openings OP of the passivation layer PA partially expose every other line pattern MP of the conductive layer M2, as shown in FIG. 4 and FIG. 5.

In some embodiments, when each line pattern MP of the conductive layer M2 has wide parts WP and narrow parts NP alternately arranged, the openings OP of the passivation layer PA partially expose the wide parts WP of the line patterns MP of the conductive layer M2, as shown in FIG. 6 and FIG. 7.

The shapes of the openings OP of the passivation layer PA may be designed as needed. In some embodiments, the openings OP of the passivation layer PA are in a form of strips or bars, as shown in FIG. 2 and FIG. 4. In some embodiments, the openings OP of the passivation layer PA are in a form of islands, as shown in FIG. 3 and FIG. 5 to FIG. 7. The islands may be circular, oval, triangular, square, rectangular, polygonal or a combination thereof. For example, the openings OP of the passivation layer PA are square, as shown in FIG. 3, FIG. 5 and FIG. 6. For instance, the openings OP of the passivation layer PA are triangular, as shown in FIG. 7. The shapes and configurations of the openings OP of the passivation layer PA are not limited to the present disclosure.

Figure 1E:
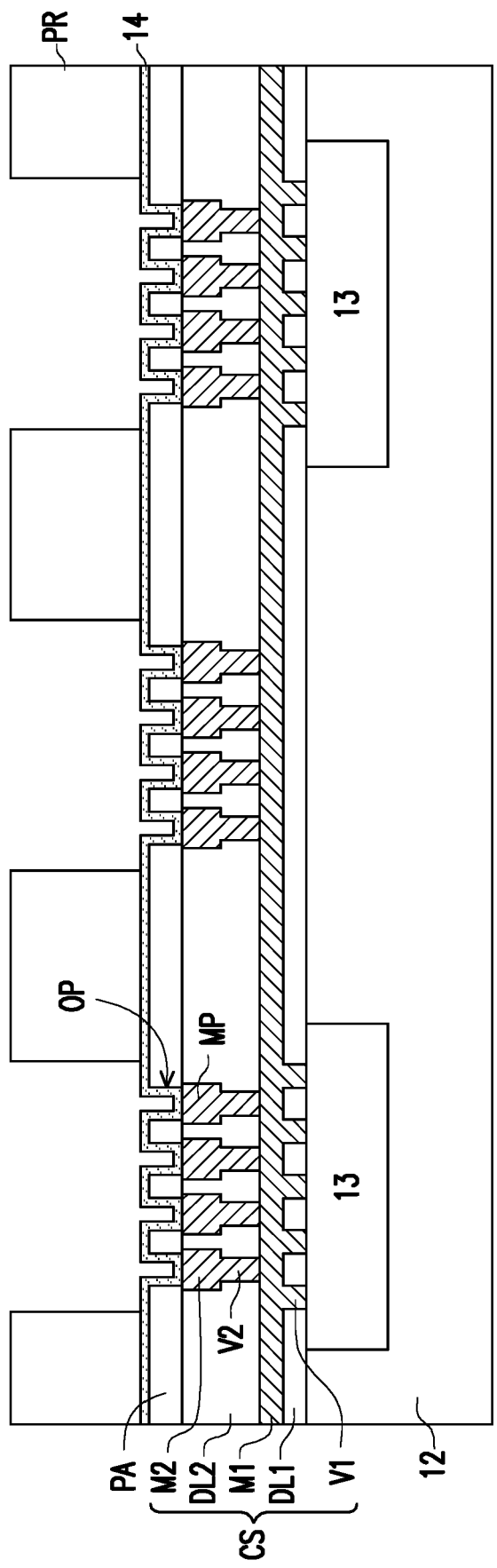

Referring to FIG. 1E, an under bump metallization (UBM) layer 14 is formed over the passivation layer PA and fills in the openings OP of the passivation layer PA. In some embodiments, the openings OP of the passivation layer PA are lined with the UBM layer 14. Specifically, the UBM layer 14 is conformally formed on the top surface of the passivation layer PA and on the entire surfaces of the openings OP. The UBM layer 14 may include copper and/or titanium, and may be formed by a sputtering process.

Figure 1F:
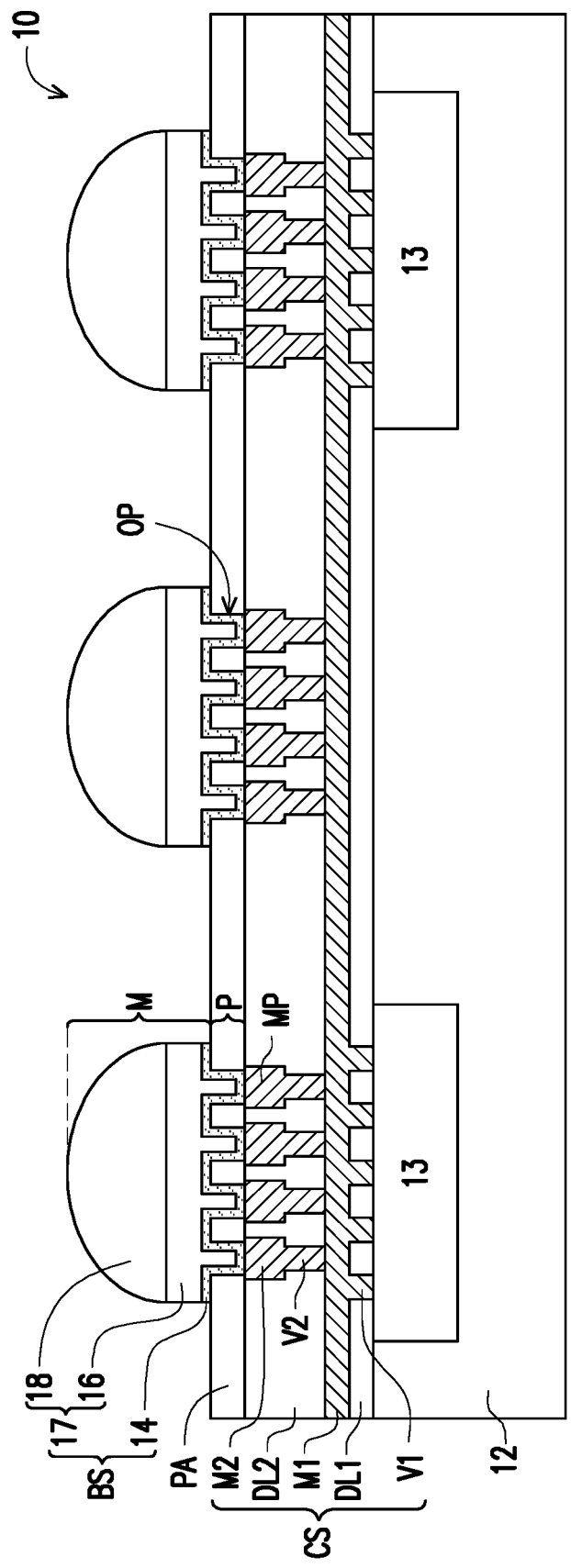

Referring to FIG. 1E and FIG. 1F, bumps 17 are formed over the UBM layer 14, and the bumps 17 fill in the openings OP of the passivation layer PA. In some embodiments, each of the bumps 17 includes a lower bump 16 and an upper bump 18 made by different materials. In some embodiments, as shown in FIG. 1E, a photoresist layer PR is formed on the UBM layer 14. The photoresist layer PR is a dry film resist (DFR) and has openings that expose the intended locations for the subsequently formed bumps. Thereafter, as shown in FIG. 1F, lower bumps 16 are formed in the openings of the photoresist layer PR with an electrochemical plating (ECP) process. In some embodiments, the lower bumps 16 are plated in the openings of the photoresist layer PR by using the UBM layer 14 as a seed layer. In some embodiments, the lower bumps 16 include copper. Afterwards, upper bumps 18 are formed on the lower bumps 16 with evaporation, electroplating, ball drop, or screen printing. In some embodiments, the upper bumps 18 include solder. The bumps 17 including lower bumps 16 and upper bumps 18 are accordingly formed. The photoresist layer PR and the underlying UBM layer 14 are then removed. Therefore, the remaining UBM layer 14 is between the passivation layer PA and each of the lower bumps 16 of the bumps 17. A bump structure BS including a bump 17 and an underlying UBM layer 14 is thus completed.

The structure of the semiconductor device of the present disclosure is illustrated below with reference to the cross-sectional view of FIG. 1F and the top views of FIG. 2 to FIG. 7.

In some embodiments, a semiconductor device 10 includes a substrate 12, a conductive structure CS, a passivation layer PA and a bump structure BS. The substrate 12 has at least one electronic component 13 therein. In some embodiments, the at least one electronic component 13 includes an integrated passive device such as a trench capacitor. The conductive structure CS includes a conductive layer M1 over and electrically connected to the at least one electronic component 13, and a conductive layer M2 over and electrically connected to the conductive layer M1. In some embodiments, the extending direction of the conductive layer M2 is different from (e.g., perpendicular to) the extending direction of the conductive layer M1. Specifically, the conductive layer M2 includes a plurality of lines patterns MP over and electrically connected to the at least one electronic component 13. The passivation layer PA is over the conductive structure CS. The bump structure BS penetrates through the passivation layer PA and is electrically connected to the conductive layer M2.

In some embodiments, each bump structure BS includes a bump 17 and an UBM layer 14 between the bump 17 and the passivation layer PA. In some embodiments, the bump 17 includes a lower bump 16 and an upper bump 18, and the lower bump 16 and the upper bump 18 include different materials. In some embodiments, as shown in FIG. 1F, each bump structure BS includes a main part M and a plurality of protruding parts P that protrude out from the main part M. The UBM layer 14 and a portion of the lower bump 16 constitute the protruding parts P of the bump structure BS. Specifically, the protruding parts P protrude out from the lower bump 16 of the bump 17. The protruding parts P of the bump structure BS penetrate through the passivation layer PA and are electrically connected to the lines patterns MP of the conductive layer M2. From another point of view, each bump structure BS has a comb-like structure, the main part M is a comb shaft part, and the protruding parts P are comb tooth parts.

The protruding parts P of each bump structure BS are the parts filling in the corresponding openings PA of the passivation layer PA. Accordingly, the protruding parts P of the bump structure BS have a shape similar to that of the openings OP of the passivation layer PA, either from a cross-sectional view or from a top view. In some embodiments, the protruding parts P of each bump structure BS are in a form of islands or strips or combinations thereof. In some embodiments, as shown in FIG. 2 to FIG. 6, the protruding parts P of each bump structure BS have a width W1 and a length L1 from a top view, and the ratio of the length L1 to the width W1 is about 1 or more, about 5 or more or about 10 or more.

The main part M of each bump structure BS is the part above the top surface of the passivation layer PA or the UBM layer 14. The main part M of each bump structure BS has a shape similar to that of the UBM layer 14 from a top view. In some embodiments, as shown in FIG. 2 to FIG. 6, the main parts M of each bump structure BS has a width W2 and a length L2 from a top view, and the ratio of the length L2 to the width W2 is about 1 or more, about 3 or more or about 5 or more.

In some embodiments, as shown in the top view of FIG. 2, FIG. 3, FIG. 6 and FIG. 7, the protruding parts P of the bumps structure BS partially expose each of the line patterns MP of the conductive layer M2. However, the present disclosure is not limited thereto. In some embodiments, the protruding parts P of the bumps structures BS partially expose every other line pattern MP of the conductive layer M2, as shown in FIG. 4 and FIG. 5. In some embodiments, as shown in FIG. 6 and FIG. 7, each of the line patterns MP has wide parts WP and narrow parts NP arranged alternately, and the protruding parts P of the bump structures BS physically contact the wide parts W of the line patterns MP. In some embodiments, from the top views of FIG. 2 to FIG. 7, the bump structures BS in adjacent columns are arranged in a staggered manner.

In the present disclosure, the conventional wide metal block is divided into multiple metal segments or lines, so the metal density and therefore the device cost are accordingly reduced. The semiconductor device of the present disclosure is a multi-terminal device such as a multi-terminal integrated passive device including capacitors. With such design, ESR (Equivalent Serial Resistance) and ESL (Equivalent Serial Inductance) properties of the device are reduced, and the reliability of the device is accordingly improved.

The multi-terminal semiconductor device of the present disclosure may be applied to various integrated circuits and/or printed circuit boards (PCBs) for operations as needed. The following embodiments in which the multi-terminal semiconductor device of the present disclosure is applied to an integrated fan-out package are provided for illustration purpose, and are not construed as limiting the present disclosure.

FIG. 8A to FIG. 8D are cross-sectional views of a method of forming an integrated fan-out packages in accordance with some embodiments.

Figure 8A:
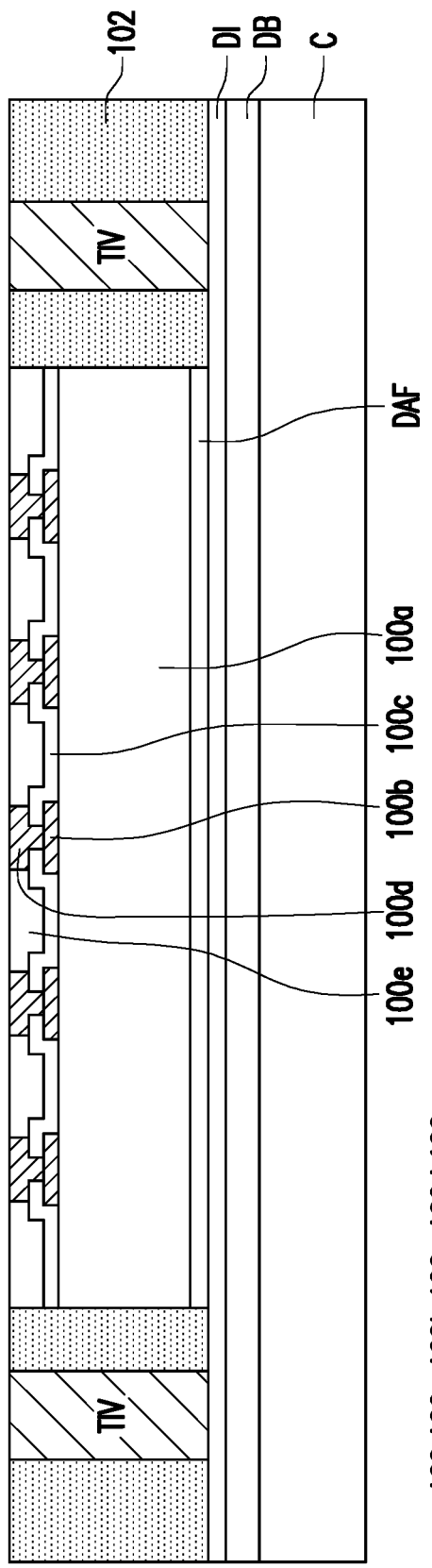
FIG. 8A to FIG. 8D are cross-sectional views of a method of forming an integrated fan-out package in accordance with some embodiments.

Referring to FIG. 8A, a carrier C is provided with a semiconductor chip 100 and a plurality of through integrated fan-out vias TIV aside the semiconductor chip 100. In some embodiments, the carrier C has a de-bonding layer DB and a dielectric layer DI formed thereon, and the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polymer layer formed on the de-bonding layer. For example, the dielectric layer DI includes polybenzoxazole (PBO), polyimide (PI), a suitable organic or inorganic material or the like. In some embodiments, the semiconductor chip 100 has a substrate 100a, pads 100b over the substrate 100a, a passivation layer 100c over the substrate 100a and exposing portions of the pads 100b, connectors 100d over the passivation layer 100c and electrically connected to the pads 100b, and a protection layer 100e over the passivation layer 100c and aside the connectors 100d. In some embodiments, the connectors 100d include solder bumps, gold bumps, copper pillars or the like, and are formed by an electroplating process. In some embodiments, the protection layer 100e includes polybenzoxazole (PBO), polyimide (PI), a suitable organic or inorganic material or the like. In some embodiments, the through integrated fan-out vias TIV include copper and are formed by photolithography, plating, and photoresist stripping processes. In some embodiments, the semiconductor chip 100 is picked and placed on the carrier C with the backside thereof facing the dielectric layer DI, and the through integrated fan-out vias TIV are then formed on the carrier C. In some embodiments, a die attach film DAF is provided between the backside of the semiconductor chip 100 and the de-bonding layer DB of the carrier C.

Still referring to FIG. 8A, an encapsulant 102 is formed over the carrier C to encapsulate the semiconductor chip 100 and the through integrated fan-out vias TIV. In some embodiments, the encapsulant 102 surrounds the semiconductor chip 100 and the through integrated fan-out vias TIV, and exposes the surfaces of the through integrated fan-out vias TIV and the connectors 100d. The encapsulant 102 includes a molding compound such as epoxy, a photo-sensitive material such as polybenzoxazole (PBO), polyimide (PI) or benzocyclobutene (BCB), a combination thereof or the like. The method of forming the encapsulant 102 includes forming an encapsulant material layer on the carrier C covering the semiconductor chip 100 and the through integrated fan-out vias TIV, and performing a grinding process to partially remove the encapsulant material layer until the surfaces of the through integrated fan-out vias TIV and the connectors 100d are exposed.

Figure 8B:
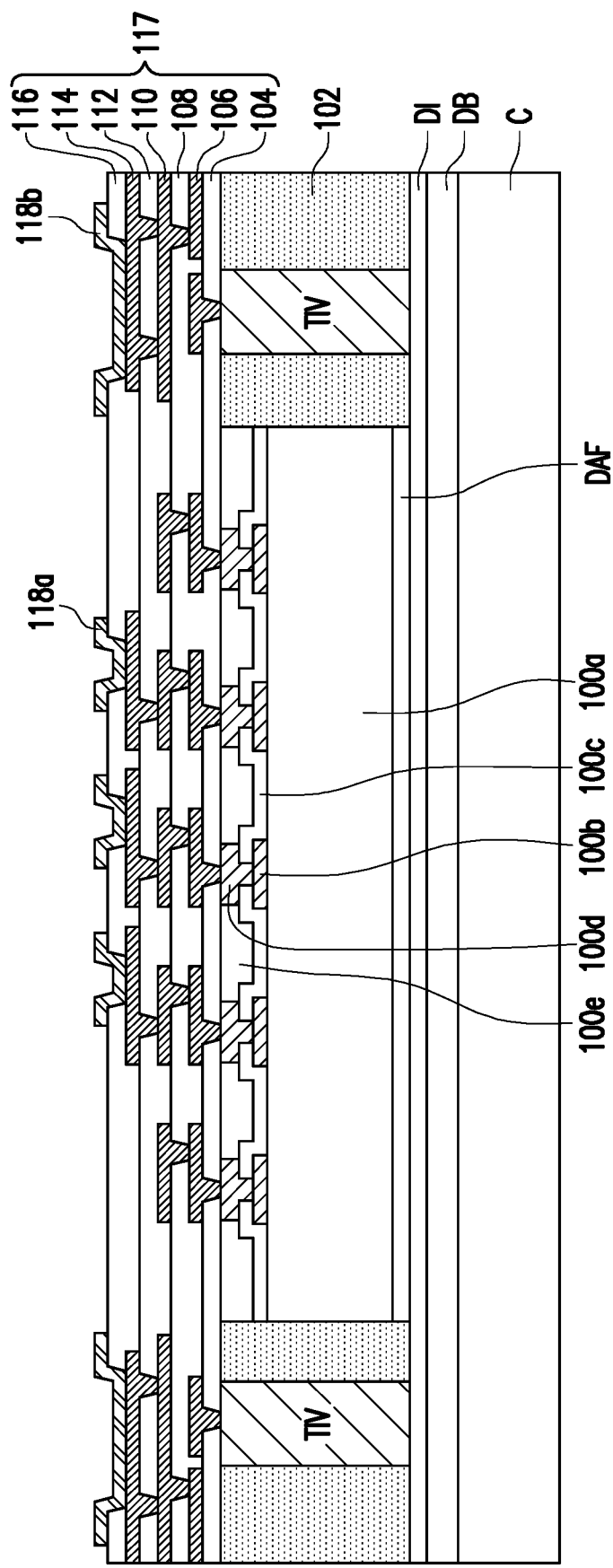

Referring to FIG. 8B, a redistribution layer structure 117 is formed over and electrically connected to the semiconductor chip 100. In some embodiments, the redistribution layer structure 117 is referred to as a front-side redistribution layer structure. In some embodiments, the redistribution layer structure 117 includes a plurality of polymer layers 104, 108, 112 and 116 and a plurality of redistribution layers 106, 110 and 114 stacked alternately. Specifically, the redistribution layer 106 is electrically connected to the connectors 100d and the through integrated fan-out vias TIV and penetrates through the polymer layer 104, the redistribution layer 110 is electrically connected to the redistribution layer 106 and penetrates through the polymer layer 108, the redistribution layer 114 is electrically connected to the redistribution layer 110 and penetrates through the polymer layer 112, and the polymer layer 116 covers the redistribution layer 114. In some embodiments, each of the polymer layers 104, 108, 112 and 116 includes a photo-sensitive material such as polybenzoxazole (PBO), polyimide (PI), benzocyclobutene (BCB), a combination thereof or the like. In some embodiments, each of the redistribution layers 106, 110 and 114 includes copper, nickel, titanium, a combination thereof or the like, and is formed by an electroplating process. The number of the polymer layers or the redistribution layers of the redistribution layer structure 117 is not limited by the present disclosure.

Still referring to FIG. 8B, a plurality of connection pads 118a and a plurality of UBM pads 118b are formed over the redistribution layer structure 117. The connection pads 118a and the UBM pads 118b are electrically connected to the redistribution layer structure 117. In some embodiments, the UBM pads 118b surround the connection pads 118a. In some embodiments, the connection pads 118a and the UBM pads 118b include copper, nickel, titanium, a combination thereof or the like, and are formed by an electroplating process. In some embodiments, the UBM pads 118b have a dimension greater than that of the connection pads 118a.

Figure 8C:
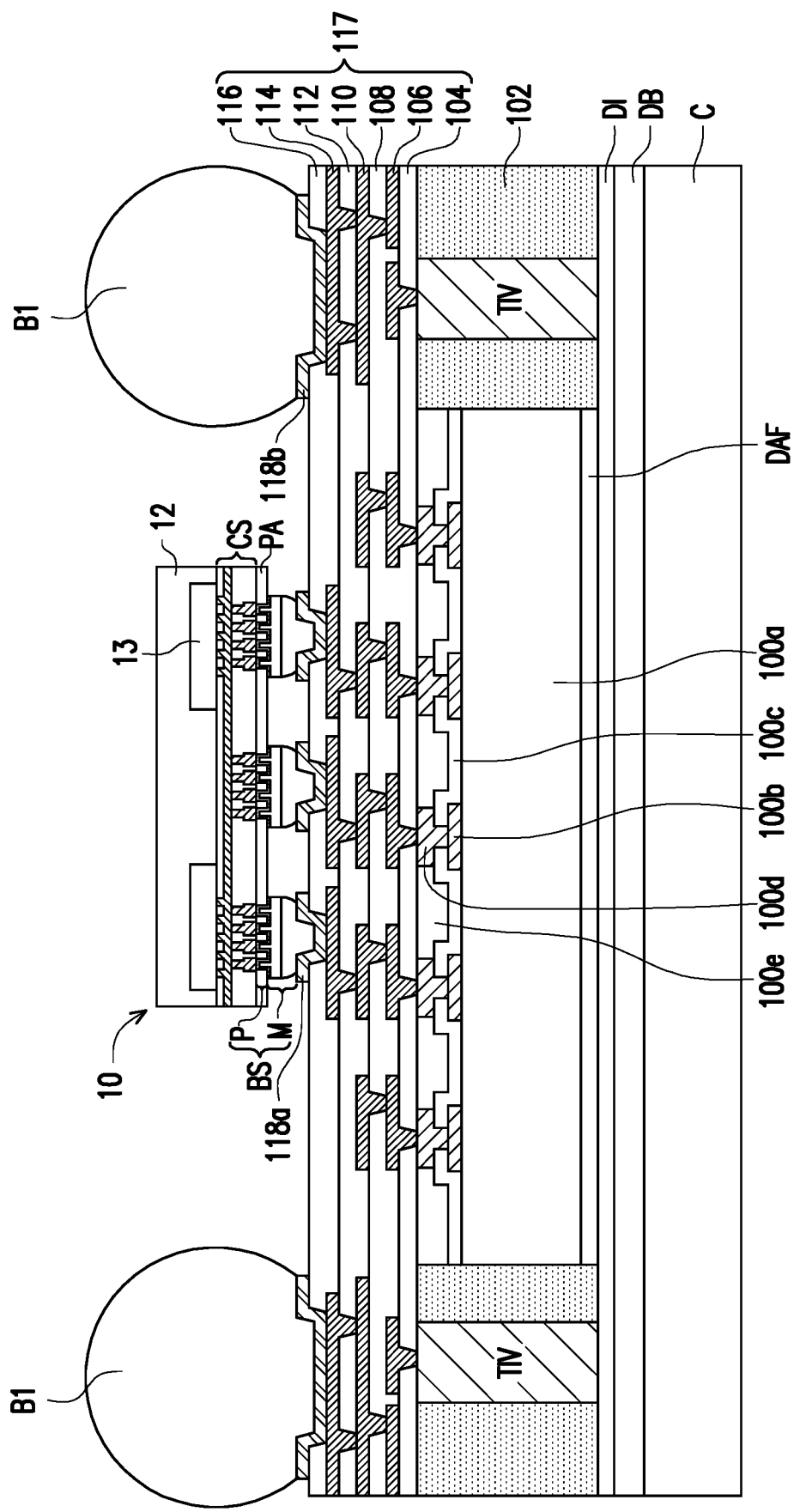

Referring to FIG. 8C, at least one semiconductor device 10 is bonded to the connection pads 118a through the bump structures BS, and a plurality of bumps B1 is placed on and electrically connected to the UBM pads 118b. In some embodiments, the semiconductor device 10 having bump structures BS is bonded to the connection pads 118a with the front side thereof facing the front-side redistribution layer structure 117. In some embodiments, the semiconductor device 10 is an integrated passive device including resistors, capacitors, inductors, resonators, filters, and/or similar elements. In alternative embodiments, the semiconductor device 10 can be an integrated active device upon the process requirements. In some embodiments, the dimension of the bumps B1 is greater than the dimension of the bump structures BS.

The material, element relationship and forming method of the bump structures BS have been described above, so the details are not iterated herein. The bumps B1 may be solder bumps, and/or may include metal pillars (e.g., copper pillars), solder caps formed on metal pillars, and/or the like. The bumps B1 may be formed respectively by a suitable process such as evaporation, electroplating, ball drop, or screen printing.

Figure 8D:
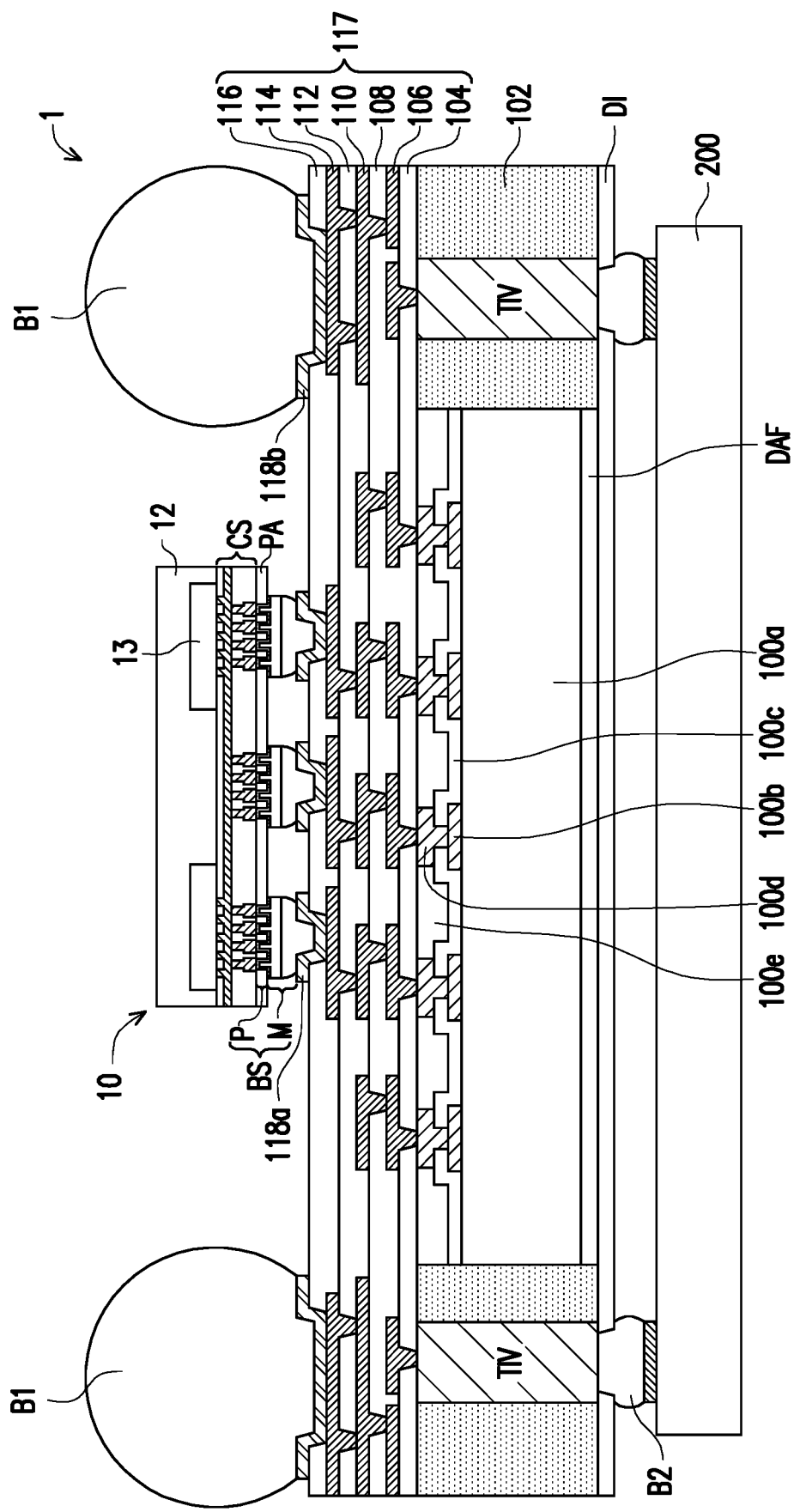

Referring to FIG. 8D, the carrier C is de-bonded from the backside of the structure of FIG. 8C. In some embodiments, the de-bonding layer DB is decomposed under heat of light, and the carrier C is then released from the structure formed thereon.

As shown in FIG. 8D, the dielectric layer DI is patterned such that openings are formed to expose the bottom surfaces of the through integrated fan-out vias TIV. In some embodiments, the number of the openings correspond to the number of the through integrated fan-out vias TIV. In some embodiments, the openings of the dielectric layer DI are formed by a laser drilling process or another suitable patterning process.

Still referring to FIG. 8D, another package 200 is provided. In some embodiments, the package 200 includes a memory device or another suitable semiconductor device. In some embodiments, the package 200 has bumps B2 on one side thereof. The bumps B2 may be solder bumps, and/or may include metal pillars (e.g., copper pillars), solder caps formed on metal pillars, and/or the like. The bumps B2 may be formed respectively by a suitable process such as evaporation, electroplating, ball drop, or screen printing. In some embodiments, the dimension of the bumps B2 is between the dimension of the bump structures BS and the dimension of the bumps B1.

Thereafter, the bumps B2 of the package 200 are inserted into the openings of the dielectric layer DI of the integrated fan-out package 1, such that a package-on-package (POP) structure is fabricated.

The structure of the integrated fan-out package of the present disclosure is illustrated below with reference to FIG. 8D as well as FIG. 1F and FIGS. 2-7.

In some embodiments, an integrated fan-out package 1 includes a semiconductor chip 100, a redistribution layer structure 117, a plurality of connection pads 118a and a semiconductor device 10. The redistribution layer structure 117 is over and electrically connected to the semiconductor chip 100. The connection pads 118a are over and electrically connected to the redistribution layer structure 117. The semiconductor device 10 is over and electrically connected to the connection pads 118a through a plurality of bump structures BS thereof. In some embodiments, each of the bump structures BS has a main part M and a plurality of protruding parts P extending from the main part M and embedded by a passivation layer PA of the semiconductor device 10.

In some embodiments, as shown in FIG. 1F, the semiconductor device 10 includes a substrate 12 having at least one electronic component 13 therein, and a conductive layer M2 having a plurality of lines patterns MP electrically connected to the at least one electronic component 13. In some embodiments, the at least one electronic component 13 includes an integrated passive device such as a trench capacitor. In some embodiments, the line patterns MP of the conductive layer M2 physically contact the protruding parts P of the bumps structures BS.

In some embodiments, the protruding parts P of each of the bump structures BS partially expose each of the line patterns MP of the conductive layer M2, as shown in FIG. 2, FIG. 3, FIG. 6 and FIG. 7. In alternative embodiments, the protruding parts P of each of the bump structures BS partially expose every other line pattern MP of the conductive layer M2, as shown in FIG. 4 and FIG. 5.

In some embodiments, the integrated fan-out package 1 further includes a plurality of UBM pads 118b and a plurality of bumps B1. The UBM pads 118b are electrically connected to the redistribution layer structure 117 and surround the connection pads 118a. The bumps B1 are electrically connected to the UBM pads 118a. In some embodiments, the dimension of the bumps B1 is greater than the dimension of the bump structures BS of the semiconductor device 10. In some embodiments, a plurality of through integrated fan-out vias TIV is further included in the integrated fan-out package 1. The through integrated fan-out vias TIV are located around the semiconductor chip 100.

In accordance with some embodiments of the present disclosure, a semiconductor device includes a substrate, a conductive layer, a passivation layer and a bump structure. The substrate has at least one electronic component therein. The conductive layer has a plurality of lines patterns over and electrically connected to the at least one electronic component. The passivation layer is over the conductive layer. The bump structure has a plurality of protruding parts penetrating through the passivation layer and electrically connected to the lines patterns of the conductive layer.

In accordance with alternative embodiments of the present disclosure, a method of forming an integrated fan-out package includes at least the following operations. At least one electronic component is formed in a substrate. A conductive structure is formed over and electrically connected to the at least one electronic component. A passivation layer is formed over the conductive structure. The passivation layer is patterned to form a plurality of openings therein. An under bump metallization (UBM) layer is formed on a top of the passivation layer and on surfaces of the openings. A bump is formed over the UBM layer, the bump filling in the openings of the passivation layer.

In accordance with yet alternative embodiments of the present disclosure, an integrated fan-out package includes a semiconductor chip, a redistribution layer structure, a plurality of connection pads and a semiconductor device. The redistribution layer structure is over and electrically connected to the semiconductor chip. The connection pads are over and electrically connected to the redistribution layer structure. The semiconductor device is over and electrically connected to the connection pads through a plurality of bump structures thereof. In some embodiments, each of the bump structures has a main part and a plurality of protruding parts extending from the main part and embedded by a passivation layer of the semiconductor device.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having at least one electronic component therein;
   a conductive layer having a plurality of lines patterns over and electrically connected to the at least one electronic component;
   a passivation layer over the conductive layer; and
   a bump structure comprising a main part and a plurality of protruding parts protruding out from the main part,
   wherein the protruding parts vertically penetrate through the passivation layer and are electrically connected to the line patterns of the conductive layer, respectively, and
   wherein each of the line patterns has a plurality of wide parts and a plurality of narrow parts arranged alternately and disposed laterally at substantially the same level, and the protruding parts of the bump structure are electrically connected to and directly above the wide parts of the line patterns, respectively.

2. The semiconductor device of claim 1, further comprising another conductive layer between the conductive layer and the substrate, wherein an extending direction of the another conductive layer is different from an extending direction of the conductive layer.

3. The semiconductor device of claim 1, wherein the plurality of protruding parts are in physical contact with the line patterns.

4. The semiconductor device of claim 1, wherein the bump structure comprises a bump and an under bump metallization (UBM) layer between the bump and the passivation layer.

5. The semiconductor device of claim 4, wherein the bump comprises a lower bump and an upper bump made by different materials.

6. The semiconductor device of claim 5, wherein the UBM layer and a portion of the lower bump constitute the protruding parts of the bump structure.

7. The semiconductor device of claim 1, wherein the protruding parts of the bump structure are in a form of islands, strips or combinations thereof.

8. The semiconductor device of claim 1, wherein the at least one electronic component comprises an integrated passive device.

9. The semiconductor device of claim 1, from a top view, a projection area of each of the protruding parts is completely within a projection area of the corresponding line pattern of the conductive layer.

10. A semiconductor device, comprising:
    a semiconductor substrate having at least one electronic component therein;
    a first conductive layer comprising a plurality of vias physically connecting the at least one electronic component in one cross-section;
    a second conductive layer comprising a plurality of conductive line patterns electrically connected to the first conductive layer; and
    at least one bump structure electrically connected to the conductive line patterns and comprising a main part and a plurality of protruding parts each protruding out from the main part,
    wherein each of the conductive line patterns has a plurality of wide parts and a plurality of narrow parts arranged alternately and disposed laterally at substantially the same level, and the protruding parts of the at least one bump structure are electrically connected to and directly above the wide parts of the conductive line patterns, respectively.

11. The semiconductor device of claim 10, further comprising a passivation layer over the conductive line patterns and aside the protruding parts of the bump structure.

12. The semiconductor device of claim 11, wherein the plurality of protruding parts are in physical contact with the conductive line patterns, respectively.

13. The semiconductor device of claim 10, wherein the at least one electronic component comprises an integrated passive device.

14. The semiconductor device of claim 10, wherein the at least one electronic component comprises an integrated active device.

15. A method of forming a semiconductor device, comprising:
    forming at least one electronic component in a substrate;
    forming a first conductive layer over the substrate, wherein the first conductive layer comprises a plurality of vias physically connecting the at least one electronic component in one cross-section;

forming a second conductive layer over the first conductive layer, wherein the second conductive layer has a plurality of line patterns electrically connected to the first conductive layer;

forming a passivation layer over the second conductive layer; patterning the passivation layer to form a plurality of openings therein; and forming a bump structure filling in each of the openings of the passivation layer, wherein the bump structure comprises a main part and a plurality of protruding parts protruding out from the main part, wherein each of the conductive line patterns has a plurality of wide parts and a plurality of narrow parts arranged alternately and disposed laterally at substantially the same level, and the protruding parts of the at least one bump structure are electrically connected to and directly above the wide parts of the line patterns, respectively.

16. The method of claim 15, wherein the plurality of line patterns of the second conductive layer are substantially parallel to each other.

17. The method of claim 15 wherein the openings of the passivation layer partially expose each of the line patterns of the second conductive layer.

18. The method of claim 15, wherein the openings of the passivation layer partially expose every other line pattern of the second conductive layer.

19. The method of claim 15, wherein forming the bump structure comprises:
   forming an under bump metallization (UBM) layer;
   forming a lower bump over the UBM layer; and
   forming an upper bump over the lower bump,
   wherein the lower bump and the upper bump comprise different materials.

20. The method of claim 15, wherein the at least one electronic component comprises an integrated passive device.

* * * * *